United States Patent
Cestra et al.

(10) Patent No.: US 10,431,357 B2
(45) Date of Patent: Oct. 1, 2019

(54) VERTICALLY-CONSTRUCTED, TEMPERATURE-SENSING RESISTORS AND METHODS OF MAKING THE SAME

(71) Applicant: Texas Instruments Incorporated, Dallas, TX (US)

(72) Inventors: Gregory Keith Cestra, Pleasanton, CA (US); Andrew Strachan, Santa Clara, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/811,069

(22) Filed: Nov. 13, 2017

(65) Prior Publication Data

US 2019/0148041 A1    May 16, 2019

(51) Int. Cl.
  *H01C 7/00* (2006.01)
  *H01C 7/06* (2006.01)

(52) U.S. Cl.
  CPC .............. *H01C 7/008* (2013.01); *H01C 7/06* (2013.01)

(58) Field of Classification Search
  CPC . H01C 7/008; H01C 7/06; G01K 7/32; G01K 17/006; H01L 27/0259; H01L 27/0255; H01L 27/0649
  See application file for complete search history.

(56) References Cited

U.S. PATENT DOCUMENTS

| | | | | |
|---|---|---|---|---|
| 7,085,688 B1* | 8/2006 | Sumida | ................... | G05B 17/02 700/31 |
| 2007/0045767 A1* | 3/2007 | Zhu | ..................... | H01L 23/3677 257/505 |
| 2008/0092094 A1* | 4/2008 | Coolbaugh | ......... | H01L 29/0821 257/510 |
| 2011/0228809 A1* | 9/2011 | Tadigadapa | .............. | G01K 7/32 374/31 |
| 2013/0231870 A1* | 9/2013 | Sugnet | .................... | G16B 40/00 702/19 |
| 2013/0333441 A1* | 12/2013 | Smith | ..................... | G01N 29/07 73/1.82 |
| 2013/0344612 A1* | 12/2013 | Zuo | ..................... | G01N 25/4806 436/147 |
| 2015/0311193 A1* | 10/2015 | Laine | .................. | H01L 27/0259 257/491 |
| 2016/0163689 A1* | 6/2016 | Laven | ..................... | H01L 45/00 257/334 |

* cited by examiner

*Primary Examiner* — Kyung S Lee
(74) *Attorney, Agent, or Firm* — Andrew R. Ralston; Charles A. Brill; Frank D. Cimino

(57) ABSTRACT

Methods and apparatus providing a vertically constructed, temperature sensing resistor are disclosed. An example apparatus includes a semiconductor substrate including a first doped region, a second doped region, and a third doped region between the first and second doped regions, the third doped region including a temperature sensitive semiconductor material; a first contact coupled to the first doped region; a second contact opposite the first contact coupled to the second doped region; and an isolation trench to circumscribe the third doped region.

20 Claims, 6 Drawing Sheets

US 10,431,357 B2

VERTICALLY-CONSTRUCTED, TEMPERATURE-SENSING RESISTORS AND METHODS OF MAKING THE SAME

FIELD OF THE DISCLOSURE

This disclosure relates generally to semiconductor devices and, more particularly, to vertically-constructed, temperature-sensing resistors and methods of making the same.

BACKGROUND

A thermistor is a type of resistor whose resistance changes with temperature. Thermistors may be used in a variety of applications as temperature sensors. For example, thermistors are commonly used in microwaves, automobiles, thermal protection circuits, digital thermometers, rechargeable batteries, etc. Thermistors require a current bias to operate, and, thus, consume power. Accordingly, high resistance thermistors may be desirable to reduce bias current and power consumption in circuits utilizing thermistors.

SUMMARY

Certain examples provide an apparatus for a vertically-constructed, temperature-sensing resistors. The example apparatus includes a semiconductor substrate including a first doped region, a second doped region, and a third doped region between the first and second doped regions, the third doped region including a temperature sensitive semiconductor material; a first contact coupled to the first doped region; a second contact opposite the first contact coupled to the second doped region; and an isolation trench to circumscribe the third doped region.

Certain examples provide an apparatus for providing a vertically-constructed, temperature-sensing resistors. The example apparatus includes a thermistor unit generator to generate a thermistor unit by applying a bondpad to a thermistor unit cells in a thermistor array to satisfy a target resistance by couple the thermistor unit cells in parallel; a resistance determiner to determine a resistance of the thermistor unit; a trimmer to, when the determined resistance is not within a threshold range of the target resistance, trim one or more of the thermistor unit cells of the thermistor unit to adjust the resistance.

Certain examples provide a method for generating a vertically constructed, temperature sensing resistor. The example method includes generating a thermistor unit by applying a bondpad to a thermistor unit cells in a thermistor array to satisfy a target resistance by couple the thermistor unit cells in parallel; determining a resistance of the thermistor unit; and when the determined resistance is not within a threshold range of the target resistance, trimming one or more of the thermistor unit cells of the thermistor unit to adjust the resistance.

Certain examples provide a computer readable storage medium comprising instructions which, when executed cause a machine to generate a vertically constructed, temperature sensing resistor. The example computer readable medium includes instructions to cause the machine to generate a thermistor unit by applying a bondpad to a thermistor unit cells in a thermistor array to satisfy a target resistance by couple the thermistor unit cells in parallel; determine a resistance of the thermistor unit; and when the determined resistance is not within a threshold range of the target resistance, trim one or more of the thermistor unit cells of the thermistor unit to adjust the resistance.

BRIEF DESCRIPTION OF THE DRAWINGS

The figures are not to scale. Wherever possible, the same reference numbers will be used throughout the drawing(s) and accompanying written description to refer to the same or like parts.

DETAILED DESCRIPTION

Thermistors are temperature-sensitive resistors (e.g., the resistance of the thermistor changes with change in temperature) that may be used in a variety of applications as temperature sensors. Such applications may include portable devices, such as mobile phones, smart watches, tablets, etc. Thermistors require a bias current and, thus, consume power during operation. The amount of power drawn by thermistors corresponds to the amount of resistance of the thermistors (e.g., higher resistance corresponds to less current/power being drawn and lower resistance corresponds to more current/power being drawn). To conserve the power being drawn by such thermistors, there is a desire to increase the resistance of thermistors.

Some thermistors may have tight tolerances benchmark, which are expected to deliver close to ideal performance under less-than-ideal operating conditions (e.g., voltage coefficients of resistance, impacts of surface charge changes, etc.). Conventional thermistor structures include a large temperature-sensitive silicon area to mitigate these less-than-ideal operating conditions. However, a large cross-sectional area of such conventional thermistor structures allows the current to spread throughout the area, thereby lowing the total resistance. For example, such conventional thermistors structures limit the total resistance value to 1-2 Kilohms (kΩ). Examples disclosed herein include silicon resistor characteristics with a reduced cross-sectional area to increase the resistance of conventional thermistors (e.g., 1-2 kΩ) to more than 5 kΩ.

Examples disclosed herein include a vertically structured thermistor and an isolation trench to reduce the cross-sectional area of temperature-sensitive semiconductor material. Examples disclosed herein further include a cell basis (e.g., modular) design (e.g., corresponding to a thermistor unit cell) in which multiple thermistors unit cells are generated in a thermistor array. A subgroup of the multiple thermistor unit cells in the array can be coupled together (e.g., in series and/or parallel) to generate a thermistor unit corresponding to a high resistance and a tight resistance tolerance. Example disclosed thermistor unit cells may be coupled in parallel using a bondpad to generate a thermistor unit. The example thermistor unit structure disclosed herein supports trimming (e.g., laser trimming) to further increase the accuracy of the thermistor unit resistance (e.g., to satisfy a desired tolerance).

Figure 1:
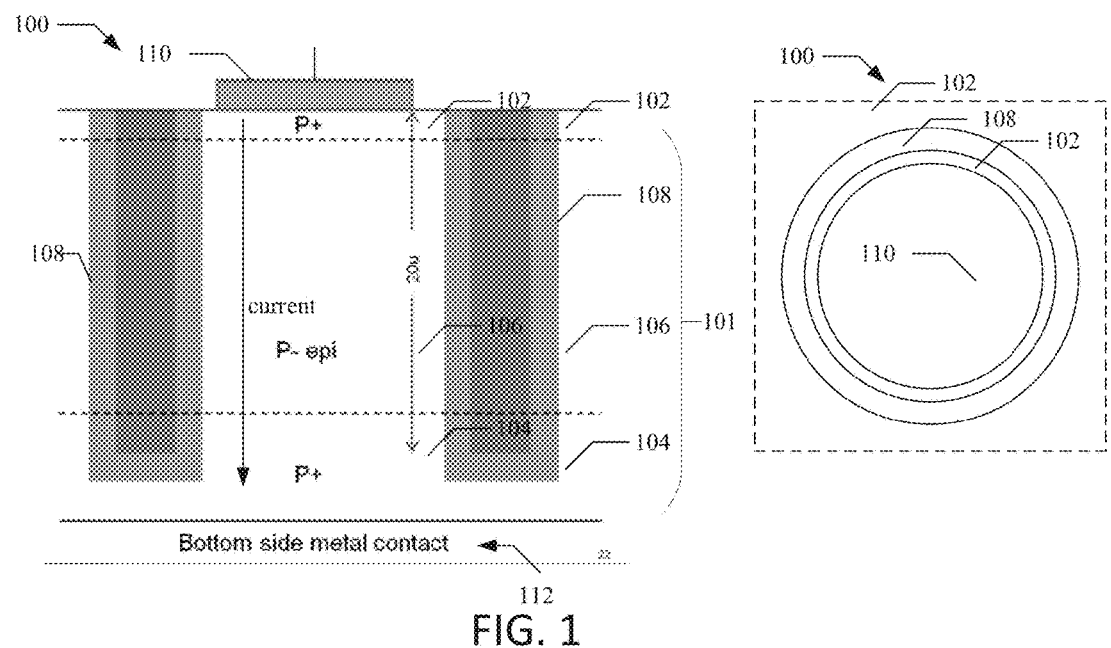
FIG. 1 is an illustration of a side view and a plan view of an example thermistor unit cell.

FIG. 1 illustrates a section view and a plan view of an example vertically-structured, temperature-sensitive resistor (e.g., thermistor) cell (e.g., unit cell) 100. The example thermistor unit cell 100 includes an example semiconductor substrate (e.g., including example P+ doped regions 102, 104 and an example P− doped epitaxy (epi) region 106), an example isolation trench 108, a first example (e.g., top-side) metal contact 110, and a second example (e.g., bottom-side) metal contact 112.

The example semiconductor substrate 301 of FIG. 1 includes semiconductor material that is split into the example P+ doped regions 102, 104 and the example P− epi region 106. The example P+ doped regions, 102, 104 are semiconductor (e.g., silicon) regions that are highly p-doped (e.g., have a larger concentration of holes than concentration of electrons), thereby having a high conductivity. The example P+ doped regions 102, 104 have a higher dopant concentration than the example P− epi region 106. The first P+ doped region 102 and the second P+ doped region boarder (e.g., to circumscribe an area of) the example P− epi region 106 (e.g., on top and bottom in a vertical construction). The example P− epi region 106 is a lightly p-doped semiconductor region made by epitaxial growth (e.g., monocrystalline silicon). The example P− epi region 106 has a lower dopant concentration than the example P+ doped regions 102, 104. The example P− epi region 106 is temperature sensitive, such that the resistance of the P− epi region is dependent on temperature. Alternatively, the example P+ doped regions 102, 104 may be any type of highly conductive material and the P− epi 106 may be any type of temperature sensitive material.

The example isolation trench 108 of FIG. 1 is a nonconductive structure that boarders (e.g., to circumscribe an area of) the P− epi region 106 (e.g., on the sides of the region in a vertical construction). As shown in the example plane view, the example isolation trench 108 wraps all the way around the P− epi region 106 to generate a fully circumscribed P− epi region 106. In this manner, the area in which current can flow through the example P− epi region 106 is defined (e.g., circumscribed) to an area inside the perimeter of the isolation trench 108. Accordingly, as the perimeter of the isolation trench 108 decreases, the area of in which the current can flow within the P− epi region 106 is reduced. By defining the area in which current can flow, the resistance of the example thermistor unit cell 100 is substantially increased. Accordingly, the perimeter of the isolation trench 108 corresponds to the total resistance of the example thermistor unit cell 100 (e.g., the smaller the parameter, the smaller the area of the example P− epi region 106 in which current can flow, the higher the total resistance). In some examples, the isolation trench 108 is just as wide and/or slightly wider than the first example metal contact 110, so that the area of the example P− epi region 106 in which current can flow is minimized (e.g., thereby maximizing resistance). In some examples, the diameter (e.g., if the isolation trench 108 corresponds to a circular shape) and/or maximum distance between opposing sides of the isolation trenches 108 is 10 micrometers (um) or less. In such examples, the thermistor unit cell 100 can have a resistance of 5 kΩ to over 100 kΩ.

The first example metal contact 110 and the second example metal contact 112 of FIG. 1 are electrodes. When a voltage source or current source provides voltage and/or current to the first example metal contact 110, current will flow from the first example metal contact 110 to the second example metal contact (e.g., through the P+ regions 102, 104 and the P− epi region 106). The resistance of the example thermistor unit cell 100 (e.g., which varies with temperature) corresponds the resistance between the metal contacts 110, 112. Although the illustrated example corresponds to a 20 um distance between the first and second example metal contacts 110, 112, the distance may correspond to a shorter or longer distance.

As shown in the plane view of the example thermistor cell unit 100 of FIG. 1, the example thermistor cell unit 100 is vertically structure where the first example contract 110 is in contact with the example P+ region 102, the example P+ region 102 is in contact with the example P− epi region 106, the example P− epi region 106 is in contact with the example P+ region 104, and the example P+ region 104 is in contact with the second example metal contact 112. In some examples, when the example thermistor cell unit 100 is generated, the example silicon regions 102, 106, 104 are formed above the second example metal contact 112. In this manner, multiple cells may be generated by generating multiple top example 110 at different locations over the stacked regions and placing the example isolation trench 108 into the example regions to contract the current flow.

Figure 2:
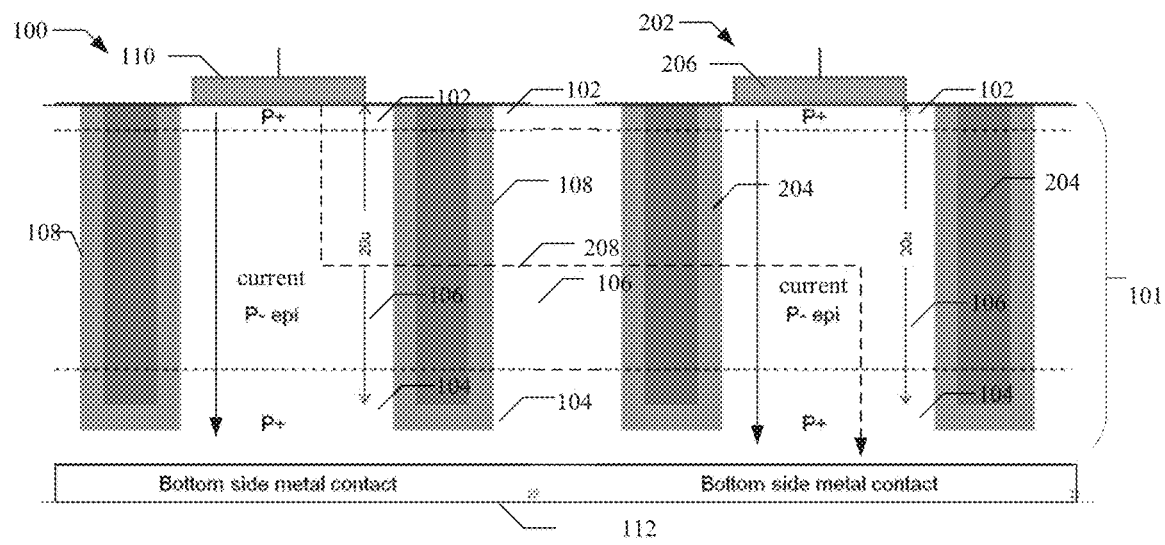
FIG. 2 is illustration of a side view of two example neighboring thermistor unit cells.

FIG. 2 is a side view of two example neighboring thermistors unit cells 100, 202. The first example thermistor unit cell 100 (e.g., corresponding to the thermistor unit cell 100) includes the example semiconductor substrate 101, the example P+ doped regions 102, 104, the example P− doped epitaxy (epi) region 106, the example isolation trench 108, the first example (e.g., top-side) metal contact 110, and the second example (e.g., bottom-side) metal contact 112 of FIG. 1. The second example thermistor unit cell 202 includes the example P+ doped regions 102, 104, the example P− doped epitaxy (epi) region 106, and the second example (e.g., bottom-side) metal contact 112 of FIG. 1. The example second example thermistor unit cell 202 further includes a second example isolation trench 204 and a third example (e.g., top-side) metal contract 206.

Figure 3:
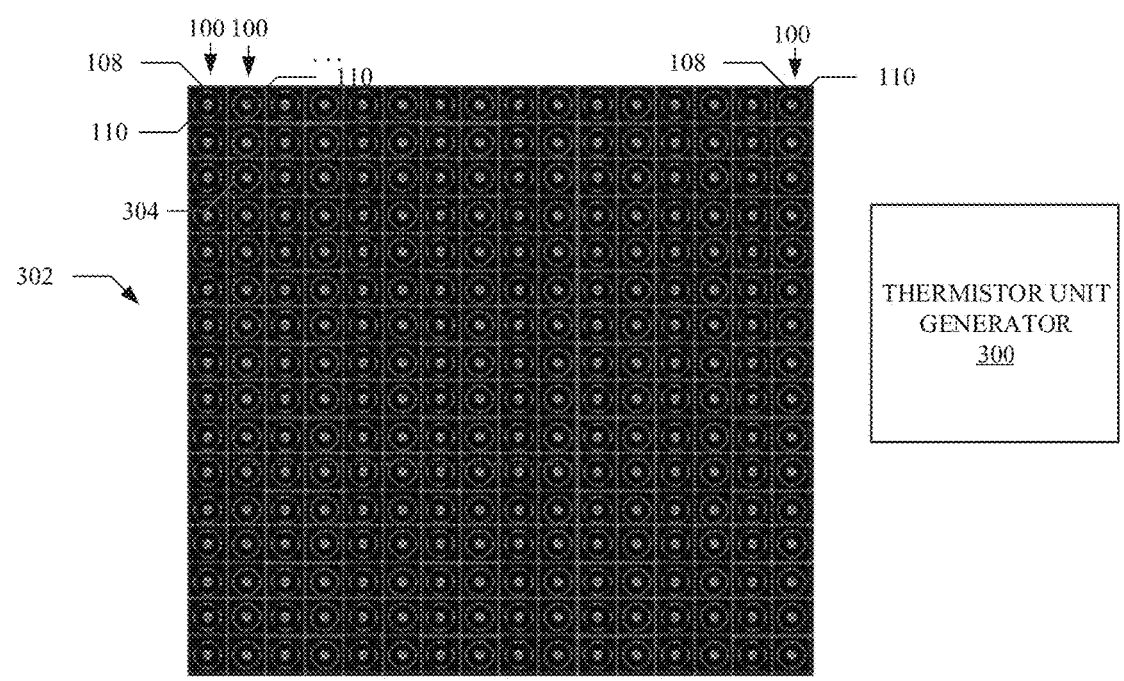
FIG. 3 is an illustration of an example thermistor unit generator to generate an example thermistor array including numerous example thermistor unit cells shown in FIG. 1.

The second example thermistor unit cell 200 of FIG. 2 is thermistor unit cell that is located next to the first example thermistor unit cell 100. In this manner, the example thermistor unit cells 100, 202 may be generated using the same example regions 102, 106, 104 while corresponding to two different thermistor unit cells by including two different top-side metal contacts 110, 206 and two different isolation trenches 108, 204. Additionally, the example thermistor unit cells 100, 202 share the second example metal contact 112. In this manner, the two example thermistor unit cell units 100, 202 may be generated out of the same semiconductor regions by including the two example metal contacts 110, 206 and the two example isolation trenches 108, 204. As further described below, in conjunction with FIGS. 4-5, the example thermistor unit cells 100, 202 may be coupled together in series or in parallel using a bondpad and/or by trimming one or more of the example thermistor unit cells 100, 202. For example, a bondpad may couple the top-side metal contacts 110, 206, thereby coupling the thermistor unit cells 100, 202 in parallel. In another example, trimming may be performed to provide an example tunnel 208 (e.g., a trim link) for current to travel from the example top-side metal contact 110 of the first example thermistor unit cell 100 to the example bottom side metal contact 112 via the second example thermistor unit cell 202, thereby coupling the thermistor unit cells 100, 202 in series FIG. 3 illustrates an example thermistor unit generator 300 to generate an example thermistor array 302 and/or an example thermistor unit 304. The example thermistor array 302 includes a plurality of the example thermistor unit cells 100, each thermistor unit cell 100 including the example isolation trench 108 and the first example metal contact 110 of FIG. 1. The example thermistor array 302 is shown as a plan view of the plurality of the example thermistor unit cells 100.

The example thermistor unit generator 300 of FIG. 3 generates the example thermistor array 302 by generating the plurality of the example thermistor unit cells 100. The example thermistor unit generator 300 constructs each of the example thermistor unit cells 100 to be placed next to each other to generate the thermistor array 302. During manufacturer of the example thermistor unit 304 of a particular resistance at a particular temperature, the example thermistor unit generator 300 determines how to structure the thermistor unit 304 by coupling multiple thermistor unit cells 100 in parallel/series. For example, if a user and/or manufacturer desires a thermistor unit corresponding to 10 KOhms and the thermistor unit cells each have a resistance of 100 KOhms, the example thermistor unit generator 300 can couple ten thermistor unit cells 100 in parallel, thereby generating a thermistor unit of 10 KOhms. Additionally, because a user and/or manufacture may require a tight resistance tolerance, the example thermistor unit generator 300 may apply trimming to one or more of the example thermistor unit cells 100 to meet the resistance tolerance after the thermistor unit 304 has been generated. Additionally or alternatively, the example thermistor unit generator 300 may apply trimming to link thermistor unit cells 100 in series to meet various target resistances (e.g., in combination with the parallel coupling). Trimming of the example thermistor unit cells 100 is possible due to the vertical structure of the example thermistor unit cell 100 and/or the modular (e.g. array-based) structure of the example thermistor array 302. The example thermistor unit generator 300 is further described below in conjunction with FIG. 6. In some examples, the thermistor unit generator 300 may generate the example thermistor array 302 such that different thermistor unit cells 100 correspond to different resistances. For example, the thermistor unit generator 300 may generate thermistor unit cells 100 with different sized/shaped isolation trenches 108, thereby corresponding to different total resistance values.

As illustrated in the example over-the-top view of the example thermistor array 302 of FIG. 3, the first example metal contact 110 and the example isolation trench 108 are circular. Alternatively, any shape may be used to generate the first example metal contact 110 and the example isolation trench 108. In some examples, the second example metal contact 112 of the example thermistor unit cell 100 of FIG. 1 is shared, or otherwise connected, amongst the plurality of thermistor unit cells 100 of the example thermistor array 302. In this manner, the example thermistor unit cells 100 may be coupled together in parallel by coupling the first example metal contact 110 together. Although the example thermistor array 302 includes 144 thermistor unit cells 100 (e.g., 12 by 12), the example thermistor array 302 may correspond to any number and/or dimension of thermistor unit cells 100.

Figure 4:
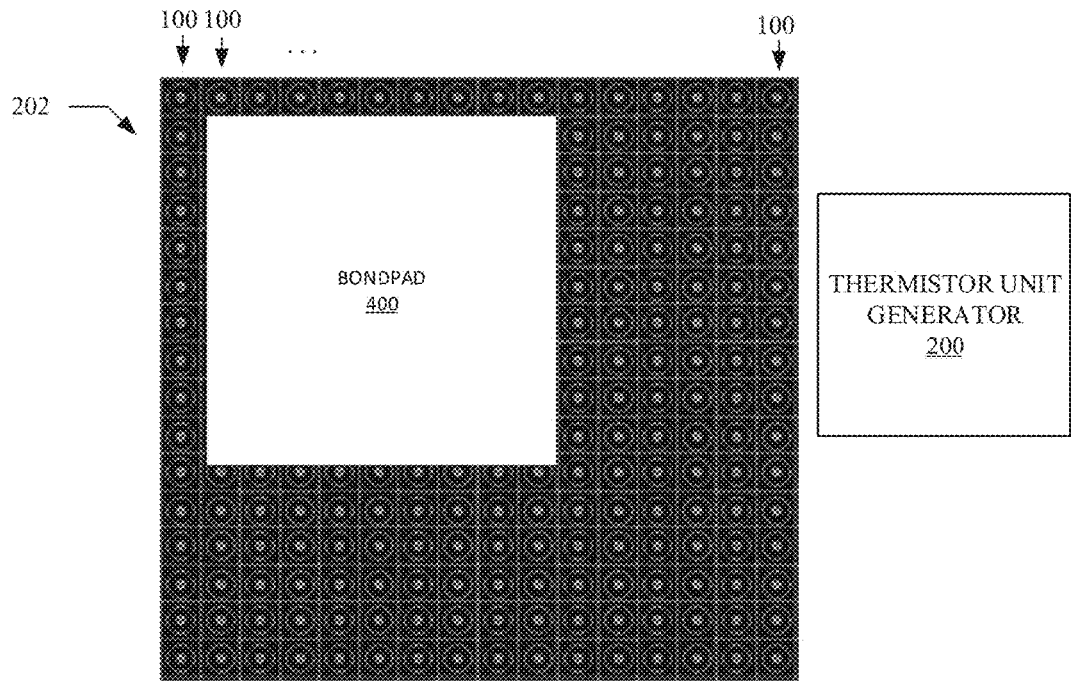
FIG. 4 is an illustration of the example thermistor unit generator coupling two or more of the example thermistor unit cells shown in FIG. 3 using an example bondpad.

FIG. 4 illustrates an example of the example thermistor unit generator 300 coupling two or more of the example thermistor unit cells 100 using an example bondpad 400. As described above, when the example thermistor unit generator 300 receives instructions to generate the example thermistor unit 304 of FIG. 3 corresponding to a predefined target resistance at a predefined temperature, multiple thermistor unit cells 100 may need to be coupled in series and/or parallel to generate the thermistor unit 304 corresponding to the predefined target resistance. Accordingly, the example thermistor unit generator 300 determines which thermistor unit cells 100 to couple together in parallel to correspond to the target resistance.

The example bondpad 400 of FIG. 4 is a conductive pad that couples to the first example metal contacts 110 of the example thermistor unit cells 100 to generate the example thermistor unit 304. Because the second example metal contact 112 of the example thermistor unit cells 100 may be shared, or otherwise coupled together, applying the example bondpad 400 to the first example metal contacts 110 of two or more thermistor unit cells 100 couples the two or more unit cells in parallel, thereby generating a thermistor unit. In this manner, the thermistor unit 304 corresponds to a thermistor of a particular resistance that can be utilized by coupling the example bondpad 400 to a voltage/current source and by coupling the second example metal contact 112 to ground (e.g., directly or indirectly). The tolerance of an individual thermistor unit cell 100 may vary more than a desired tolerance value. However, the tolerance of a thermistor unit 304 will vary much less. Accordingly, it may be desirable for the example thermistor unit generator 300 to generate the example bondpad 400 over ten 100 KOhm thermistor unit cell 100, rather than generating one 10 KOhm thermistor unit cell 100, depending on the desired tolerance, even though the resulting resistance is theoretically the same (e.g., the tolerances may be different, leading to a difference between the two thermistor units). Although the example bondpad 400 couples eighty-one thermistor unit cells 100 together in a nine-by-nine dimension, the example thermistor unit generator 300 may generate the bondpad 400 to include any number or dimension of thermistor unit cells 100 based on a target resistance. Once the example bondpad 400 couples two or more thermistor unit cells together in parallel to generate the thermistor unit 304. The bondpad 400 can be coupled to a device as a first terminal and the second example contact 112 (e.g., which is shared by all thermistor unit cells 100) can couple to the device as a second terminal.

Figure 5:
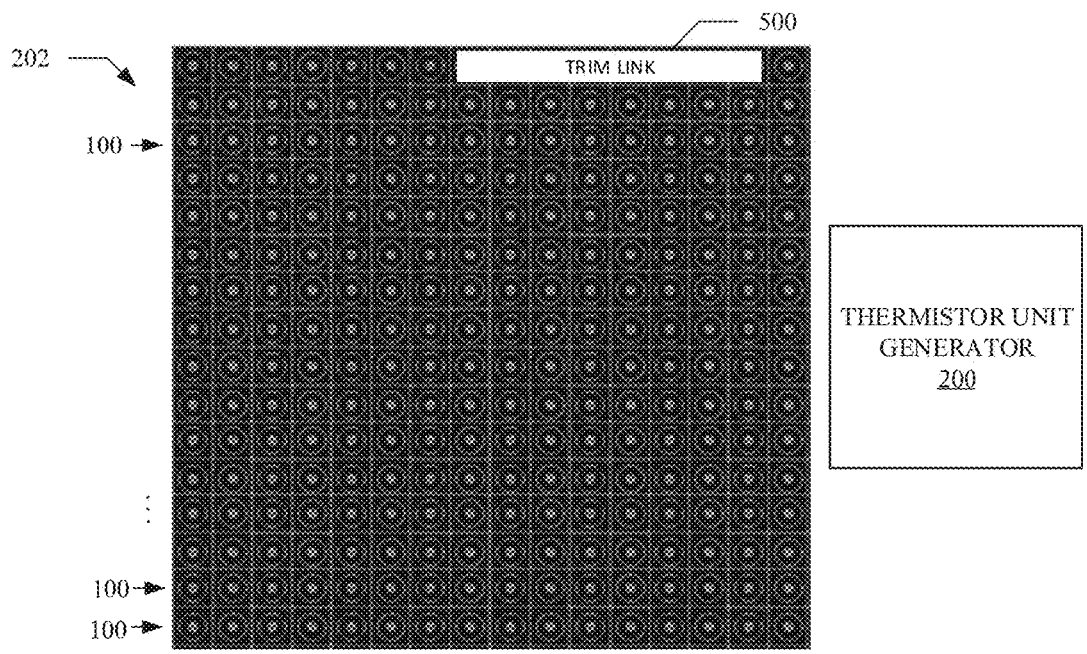
FIG. 5 is an illustration of the example thermistor unit generator adjusting the resistance of two or more of the example thermistor unit cells shown in FIG. 3 using an example trim link.

FIG. 5 illustrates an example of the example thermistor unit generator 300 adjusting the resistance of two or more of the example thermistor unit cells 100 using an example trim link 500. As described above, when the example thermistor unit generator 300 receives instructions to generate a example thermistor unit (e.g., the example thermistor unit 304 of FIG. 3) corresponding to a predefined target resistance at a predefined temperature, trimming may be required to adjust a thermistor unit (e.g., the example thermistor unit 304 of FIG. 3) and/or to generate a desired thermistor unit with a target resistance. Accordingly, the example thermistor unit generator 300 determines which thermistor unit cells 100 to trim to correspond to the target resistance.

The example trim link 500 corresponds to a conductive material (e.g., metal) that is rendered non-conductive when the example thermistor unit generator 300 generates one or more pulses of a laser directed at the thermistor unit cell(s) 100. The laser melts and/or vaporizes the conductive link material to remove it from the conductive path where current can flow, thereby adjusting the resistance of the example thermistor unit cell(s) 100 within the trim link 500. In some examples, the thermistor unit generator 300 generates the trim link 500 after the bondpad 400 has been applied. For example, the thermistor unit generator 300 may trim one or more of the example thermistor unit cells 100 to so that the resistance of a thermistor unit is closer to the target resistance, thereby improving the tolerance of the thermistor unit. In some examples, the example thermistor unit generator 300 generates the trim link 500 (e.g., by applying the one or more laser pulse(s)) to couple one or more thermistor unit cells 100 in series, thereby generating different combinations of resistance values for different trim linked thermistor unit cells 100. In such examples, the example trim link 500 that generates different resistance values may be utilized in combination with the example bondpad 400 of FIG. 4 to generate more combination of target resistances for a thermistor unit. As described above, the example vertical structure of the example thermistor unit cell 100 and/or the parallel structure of the example thermistor array 302 allows for the example thermistor unit generator 300 to trim the example thermistor unit cells 100 and/or a thermistor unit.

Figure 6:
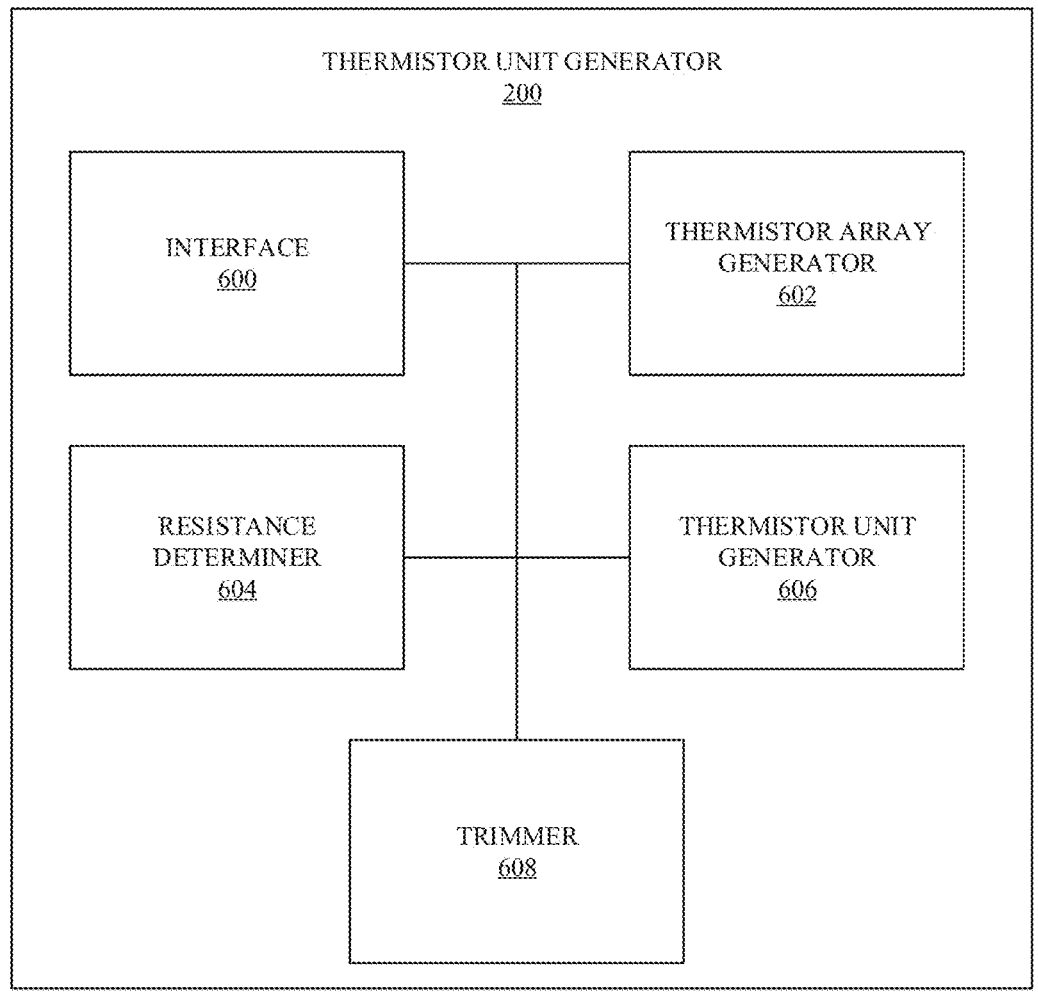
FIG. 6 is a block diagram of the example thermistor unit generator of FIGS. 3-5.

FIG. 6 is a block diagram of the example thermistor unit generator 300 of FIGS. 3-5 disclosed herein, to generate the example thermistor unit cell 100 of FIG. 1, the example thermistor array 302 of FIG. 3, and/or the example thermistor unit 304 (e.g., corresponding to the example bondpad 400 and/or the example trim link 500 of FIGS. 4 and/or 5). While the example thermistor unit generator 300 is described in conjunction with the example thermistor unit cell 100, the example thermistor array 302, and/or thermistor unit corresponding to FIGS. 1-4, the example thermistor unit generator 300 may be utilized to generate any type of thermistor unit cell and/or thermistor unit array. The example thermistor unit generator 300 includes an example interface 600, an example thermistor array generator 602, an example resistance determiner 604, an example bondpad generator 606, and an example trimmer 608.

The example interface 600 of FIG. 6 receives instructions from a user or a device regarding the parameters for generating the example thermistor unit 304. Such parameters may include, resistance value, tolerance, size/dimensions, etc. For example, the interface 600 may receive instructions to generate a 10 KOhm thermistor unit that is no larger than 10,000 um$^2$ with a tolerance of 5%. In some examples, the interface 600 provides instructions a user and/or device based on the different thermistor values that the example thermistor unit generator 300 is capable of generating, and the user/device selects from the available options. The example interface 600 forwards the thermistor parameters to the example thermistor array generator 602.

The example thermistor array generator 602 of FIG. 6 generates the example thermistor cell unit(s) 100 and/or the thermistor array 302 of FIG. 3 based on the received thermistor parameters. In some examples, the thermistor array generator 602 generates the example array to include the exact number of thermistor unit cells 100 to satisfy the thermistor parameters. In some examples, the thermistor array generator 602 may generate the array to include additional thermistor unit cells 100, as a safety net. In some examples, the thermistor array generator 602 may generate multiple thermistor unit cells using the same thermistor array 302. For example, the thermistor array generator 602 may generate two thermistor units with two different bondpads 400 and couple the two thermistor units in series or parallel to generate a target resistance.

The example resistance determiner 604 of FIG. 6 determines the resistance of the example thermistor unit cells 100 and/or the example thermistor unit 304. For example, although the example thermistor array generator 602 may generate the example thermistor unit cells 100 to have a particular resistance, the actual resistance of the generated thermistor unit cells 100 may vary from the intended resistance. Accordingly, the example resistance determiner 604 determines the resistance of each thermistor unit cell 100, so that the example bondpad generator 606 can generate the thermistor unit 304 more accurately. Additionally, the example resistance determiner 604 determines the resistance of the thermistor unit 304, once generated. In this manner, if the actual resistance of the thermistor unit 304 is not within a target tolerance, the example trimmer 608 can trim one or more thermistor unit cells 100 of the thermistor unit 304 to adjust the actual resistance.

The example bondpad generator 606 of FIG. 6 generates the example thermistor unit 304 based on the thermistor parameters and a variety of techniques. For example, the bondpad generator 606 can generate the example bondpad 400 of FIG. 4 and/or instruct the example trimmer 608 to generate the example trim link 500 of FIG. 5 to couple the example thermistor unit cells 100 together in series and/or in parallel to satisfy the received thermistor parameters, as described above in conjunction with FIGS. 4 and 5.

The example trimmer 608 of FIG. 6 trims one or more of the thermistor unit cells 100 of the example thermistor array 302 (e.g., to generate the example trim link 500 of FIG. 5). As explained above in conjunction with FIG. 5, the example trimmer 608 may trim one or more of the example thermistor unit cells 100 before and/or after the example bondpad 400 is applied (e.g., coupled to the first example metal contact 110 of the thermistor unit cells 100). The example trimmer 608 may trim one or more of the example thermistor unit cells 100 before the example bondpad 400 is applied to link two or more thermistor unit cells 100 together to provide additional grouping combination for the example thermistor unit 304 for target resistance that can be meet using only the example bondpad 400 (e.g., when the example thermistor array generator 602 is only capable of generating thermistor unit cells for limited resistances). The example trimmer 608 may trim one or more of the example thermistor unit cells 100 after the example bondpad 400 is applied when the thermistor unit 304 corresponding to the thermistor cell unit does not satisfy the target tolerance (e.g., the resistance of the thermistor unit 304 is not within a threshold range of the target resistance). The example trimmer 608 trims the one or more example thermistor unit cells 100 to adjust the resistance to satisfy the target tolerance.

While an example manner of implementing the thermistor unit generator 300 of FIGS. 3-5 is illustrated in FIG. 6, one or more of the elements, processes and/or devices illustrated in FIG. 6 may be combined, divided, re-arranged, omitted, eliminated and/or implemented in any other way. Further, the example interface 600, the example thermistor array generator 602, the example resistance determiner 604, the example bondpad generator 606, the example trimmer 608, and/or more generally the example thermistor unit generator 300 of FIG. 6 may be implemented by hardware, software, firmware and/or any combination of hardware, software and/or firmware. Thus, for example, any of the example interface 600, the example thermistor array generator 602, the example resistance determiner 604, the example bondpad generator 606, the example trimmer 608, and/or more generally the example thermistor unit generator 300 of FIG. 6 could be implemented by one or more analog or digital circuit(s), logic circuits, programmable processor(s), application specific integrated circuit(s) (ASIC(s)), programmable logic device(s) (PLD(s)) and/or field programmable logic device(s) (FPLD(s)). When reading any of the apparatus or system claims of this patent to cover a purely software and/or firmware implementation, at least one of the example interface 600, the example thermistor array generator 602, the example resistance determiner 604, the example bondpad generator 606, the example trimmer 608, and/or more generally the example thermistor unit generator 300 of FIG. 6 is/are hereby expressly defined to include a non-transitory computer readable storage device or storage disk such as a memory, a digital versatile disk (DVD), a compact disk (CD), a Blu-ray disk, etc. including the software and/or firmware. Further still, the example thermistor unit generator 300 of FIG. 6 may include one or more elements, processes and/or devices in addition to, or instead of, those illustrated in FIG. 6, and/or may include more than one of any or all of the illustrated elements, processes and devices.

Figure 7:
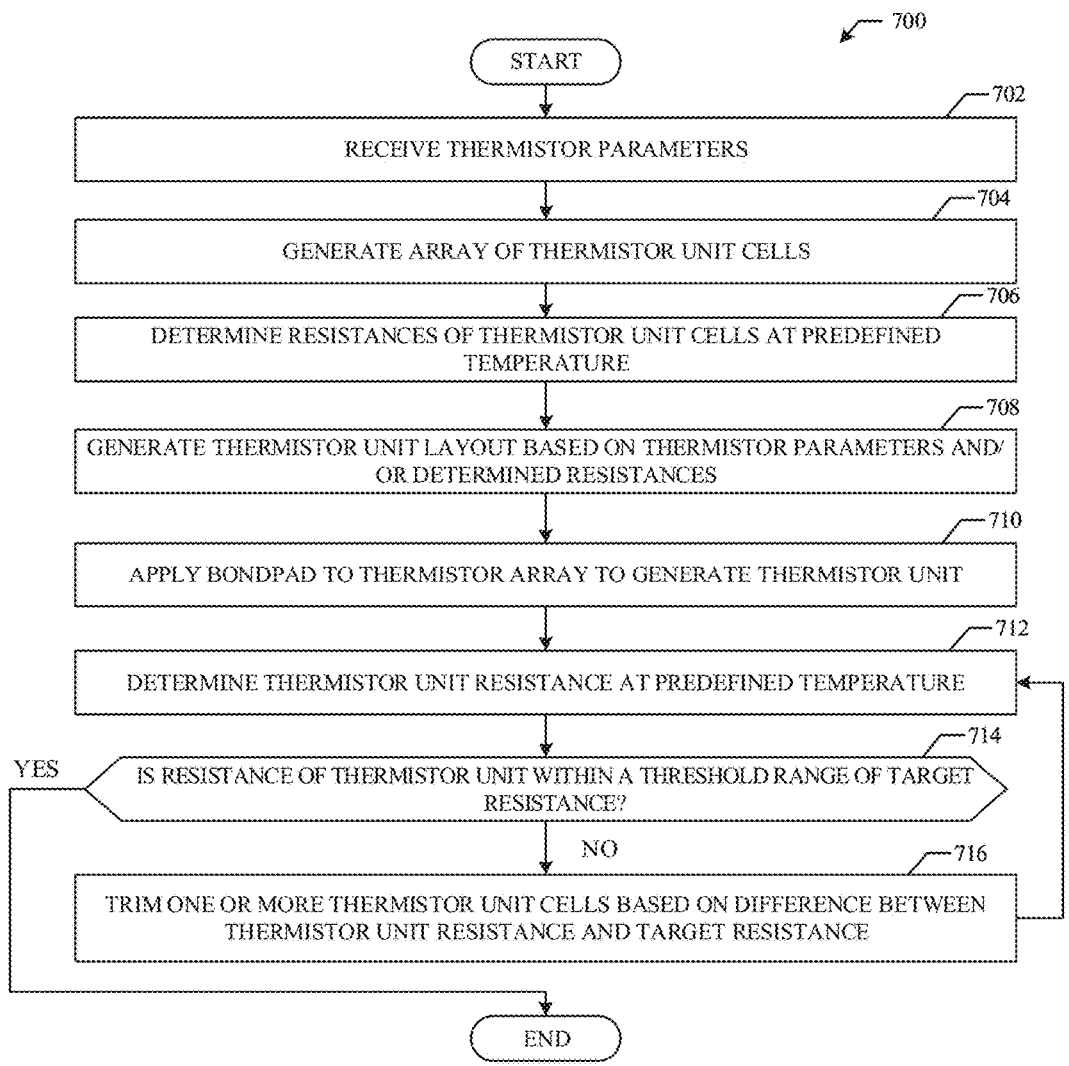
FIG. 7 is a flowchart representative of example machine readable instructions that may be executed to implement the example thermistor unit generator of FIGS. 3-6 to generate a thermistor unit.

A flowchart representative of example machine readable instructions for implementing the thermistor unit generator 300 of FIG. 6 is shown in FIG. 7. In this example, the machine readable instructions comprise a program for execution by a processor such as the processor 812 shown in the example processor platform 800 discussed below in connection with FIG. 8. The program may be embodied in software stored on a non-transitory computer readable storage medium such as a CD-ROM, a floppy disk, a hard drive, a digital versatile disk (DVD), a Blu-ray disk, or a memory associated with the processor 812, but the entire program and/or parts thereof could alternatively be executed by a device other than the processor 812 and/or embodied in firmware or dedicated hardware. Further, although the example program is described with reference to the flowchart illustrated in FIG. 7, many other methods of implementing the example thermistor unit generator 300 may alternatively be used. For example, the order of execution of the blocks may be changed, and/or some of the blocks described may be changed, eliminated, or combined. Additionally or alternatively, any or all of the blocks may be implemented by one or more hardware circuits (e.g., discrete and/or integrated analog and/or digital circuitry, a Field Programmable Gate Array (FPGA), an Application Specific Integrated circuit (ASIC), a comparator, an operational-amplifier (op-amp), a logic circuit, etc.) structured to perform the corresponding operation without executing software or firmware.

As mentioned above, the example processes of FIG. 7 may be implemented using coded instructions (e.g., computer and/or machine readable instructions) stored on a non-transitory computer and/or machine readable medium such as a hard disk drive, a flash memory, a read-only memory, a compact disk, a digital versatile disk, a cache, a random-access memory and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media. "Including" and "comprising" (and all forms and tenses thereof) are used herein to be open ended terms. Thus, whenever a claim lists anything following any form of "include" or "comprise" (e.g., comprises, includes, comprising, including, etc.), it is to be understood that additional elements, terms, etc. may be present without falling outside the scope of the corresponding claim. As used herein, when the phrase "at least" is used as the transition term in a preamble of a claim, it is open-ended in the same manner as the term "comprising" and "including" are open ended.

FIG. 7 is an example flowchart 700 representative of example machine readable instructions that may be executed by the example thermistor unit generator 300 of FIG. 1 to generate the example thermistor unit 304. Although the instructions of FIG. 7 are described in conjunction with the example thermistor unit generator 300, the example thermistor unit cell 100, and the example thermistor array 302, the example instructions may be utilized by any type of thermistor unit generator, thermistor unit cell, and/or thermistor array.

At block 702, the example interface 600 receives thermistor parameters. As described above in conjunction with FIG. 6, the thermistor parameters may include a target resistance, a target tolerance, a target size, etc. At block 704, the example thermistor array generator 602 generates an array of the example thermistor unit cells 100 (e.g., the example thermistor array 302). The example thermistor array generator 602 may generate the example thermistor array 302 based on the thermistor parameters. For example, the thermistor array generator 602 may determine a configuration of the thermistor unit cells 100 (e.g., how many thermistor unit cells and how to couple the thermistor unit cells) to satisfy the thermistor parameters. In some example, the thermistor array generator 602 generates thermistor unit cells 100 with different isolation trench 108 sizes/shapes, thereby generating thermistor unit cells 100 of different total resistance values to satisfy a target resistance.

At block 706, the example resistance determiner 604 determines the resistance of the thermistor unit cells 100 at a predefined temperature. Although the example thermistor array generator 602 has generated the example thermistor unit cells 100 to have a particular resistance value(s), the actual resistance value of the thermistor unit cells 100 may vary from the intended resistance value. Accordingly, the example resistance determiner 604 determines the resistance of the thermistor unit cells 100 for a more accurate generation of the example thermistor unit 304. At block 708, the example bondpad generator 606 generates a thermistor unit layout based on the thermistor parameters and/or the measured resistances. For example, the bondpad generator 606 determines how to apply the example bondpad 400 of FIG. 4 to couple two or more thermistor unit cells 100 in parallel to satisfy the thermistor parameters. In some examples, the bondpad generator 606 may determine if trimming is needed prior to applying the example bondpad 400 of FIG. 4. The example bondpad generator 606 may trim prior to applying the example bondpad 400 to, for example, couple two or more of the example thermistor unit cells 100 in series. In such examples, the bondpad generator 606 may instruct the example trimmer 608 to trim accordingly (e.g., to generate the example trim link 500 of FIG. 5).

At block 710, the example bondpad generator 606 applies the example bondpad 400 to the example thermistor array 302 to generate the example thermistor unit 304. At block 712, the example resistance determiner 604 determines if the resistance of the thermistor unit 304 is within a threshold range of the target resistance (e.g., the target tolerance is satisfied). The threshold range and/or target tolerance corresponds to the received thermistor parameters. If the example resistance determiner 604 determines that the resistance of the thermistor unit 304 is within a threshold range of the target resistance (block 714: YES), the process ends. If the example resistance determiner 604 determines that the resistance of the thermistor unit 304 is not within a threshold range of the target resistance (block 714: NO), the example trimmer 608 trims one or more thermistor unit cells 100 of the thermistor unit 304 based on a difference between the thermistor unit resistance and the target resistance (block 716) and the process returns to block 712. In this manner, the resistance is adjusted until the actual resistance of the thermistor unit 304 satisfies the thermistor parameters (e.g., the target tolerance).

Figure 8:
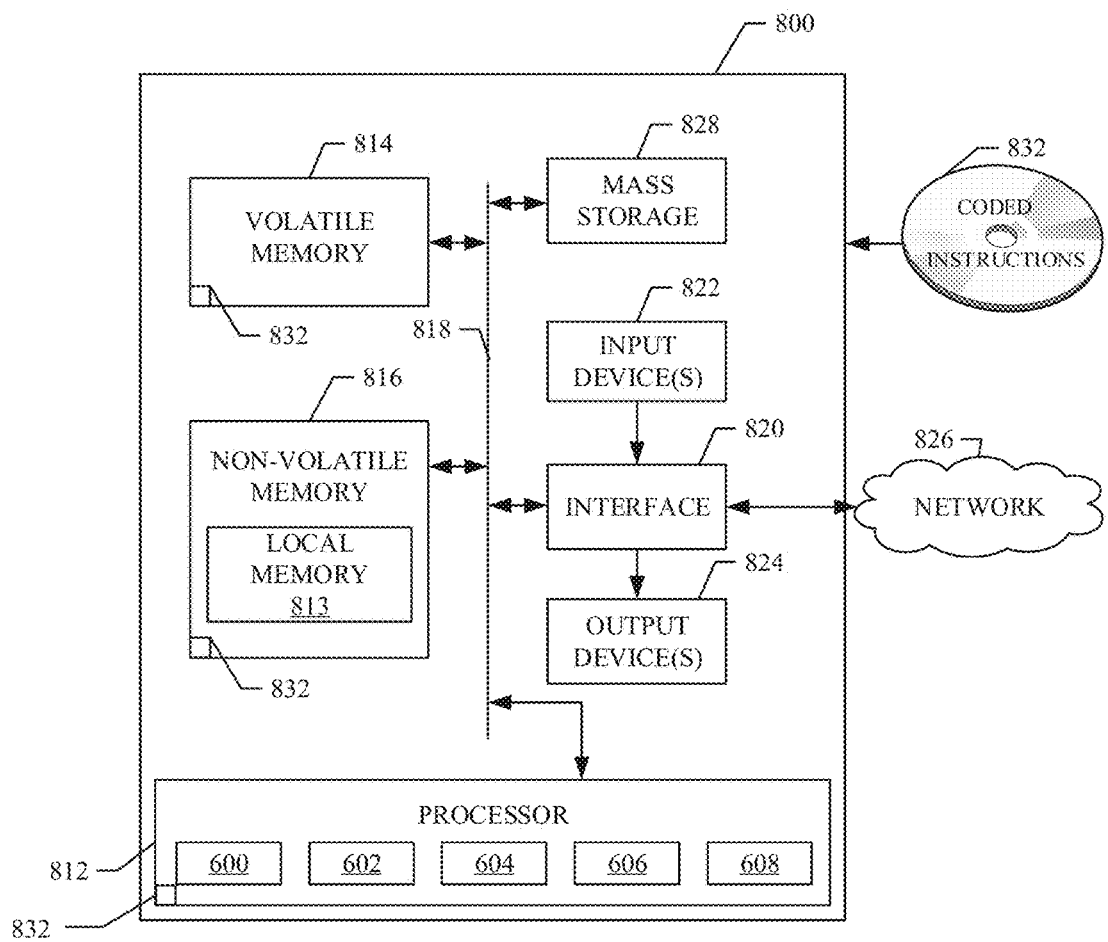
FIG. 8 is a block diagram of a processor platform structured to execute the example machine readable instructions of FIG. 6 to control the example thermistor unit generator of FIGS. 3-6.

FIG. 8 is a block diagram of an example processor platform 800 capable of executing the instructions of FIG. 7 to implement the example thermistor unit generator 300 of FIG. 6. The processor platform 800 can be, for example, a server, a personal computer, a mobile device (e.g., a cell phone, a smart phone, a tablet such as an iPad™), a personal digital assistant (PDA), an Internet appliance, a DVD player, a CD player, a digital video recorder, a Blu-ray player, a gaming console, a personal video recorder, a set top box, or any other type of computing device.

The processor platform 800 of the illustrated example includes a processor 812. The processor 812 of the illustrated example is hardware. For example, the processor 812 can be implemented by one or more integrated circuits, logic circuits, microprocessors or controllers from any desired family or manufacturer. The hardware processor may be a semiconductor based (e.g., silicon based) device. In this example, the processor implements the example interface 600, the example thermistor array generator 602, the example resistance determiner 604, the example bondpad generator 606, and/or the example trimmer 608 of FIG. 6.

The processor 812 of the illustrated example includes a local memory 813 (e.g., a cache). The processor 812 of the illustrated example is in communication with a main memory including a volatile memory 814 and a non-volatile memory 816 via a bus 818. The volatile memory 814 may be implemented by Synchronous Dynamic Random Access Memory (SDRAM), Dynamic Random Access Memory (DRAM), RAMBUS Dynamic Random Access Memory (RDRAM) and/or any other type of random access memory device. The non-volatile memory 816 may be implemented by flash memory and/or any other desired type of memory device. Access to the main memory 814, 816 is controlled by a memory controller.

The processor platform 800 of the illustrated example also includes an interface circuit 820. The interface circuit 820 may be implemented by any type of interface standard, such as an Ethernet interface, a universal serial bus (USB), and/or a PCI express interface.

In the illustrated example, one or more input devices 822 are connected to the interface circuit 820. The input device(s) 822 permit(s) a user to enter data and/or commands into the processor 812. The input device(s) can be implemented by, for example, an audio sensor, a microphone, a camera (still or video), a keyboard, a button, a mouse, a touchscreen, a track-pad, a trackball, isopoint and/or a voice recognition system.

One or more output devices 824 are also connected to the interface circuit 820 of the illustrated example. The output devices 824 can be implemented, for example, by display devices (e.g., a light emitting diode (LED), an organic light emitting diode (OLED), a liquid crystal display, a cathode ray tube display (CRT), a touchscreen, a tactile output device, a printer and/or speakers). The interface circuit 820 of the illustrated example, thus, typically includes a graphics driver card, a graphics driver chip and/or a graphics driver processor.

The interface circuit 820 of the illustrated example also includes a communication device such as a transmitter, a receiver, a transceiver, a modem and/or network interface card to facilitate exchange of data with external machines (e.g., computing devices of any kind) via a network 826 (e.g., an Ethernet connection, a digital subscriber line (DSL), a telephone line, coaxial cable, a cellular telephone system, etc.).

The processor platform 800 of the illustrated example also includes one or more mass storage devices 828 for storing software and/or data. Examples of such mass storage devices 828 include floppy disk drives, hard drive disks, compact disk drives, Blu-ray disk drives, RAID systems, and digital versatile disk (DVD) drives.

The coded instructions 832 of FIGS. 4-5 may be stored in the mass storage device 828, in the volatile memory 814, in the non-volatile memory 816, and/or on a removable tangible computer readable storage medium such as a CD or DVD.

From the foregoing, it will be appreciated that example methods, apparatus and articles of manufacture have been disclosed that provide a vertically constructed, temperature sensing resistor. Conventional thermistor structures spread resistance types with a large silicon area to avoid non-ideal effects. However, the large cross-sectional area of such conventional thermistor structures limits the total resistance value to 1-2 kΩ. Examples disclosed herein include ideal silicon resistor characteristics with a reduced cross-sectional area to increase the resistance to more than 6 kΩ.

Examples disclosed herein include a vertically structured thermistor with an isolation trench to reduce the cross-sectional area of semiconductor material that is temperature sensitive. Examples disclosed herein further include a modular design where multiple thermistors are generated to make a thermistor array that can be coupled together to generate a thermistor unit that corresponds to a high resistance and a tight tolerance. Exampled disclosed herein may be coupled together in parallel using a bondpad to generate a thermistor unit. The example thermistor unit structure disclosed herein supports trimming (e.g., laser trimming) to further increase the accuracy of the resistance of a thermistor unit (e.g., to satisfy a desired tolerance). Example disclosed herein provide a high resistance thermistor that meets tight tolerance requirements and allows for trimming to adjust resistance of the thermistor.

Although certain example methods, apparatus and articles of manufacture have been described herein, other implementations are possible. The scope of coverage of this patent is not limited thereto. On the contrary, this patent covers all methods, apparatus and articles of manufacture fairly falling within the scope of the claims of this patent.

What is claimed is:
1. An apparatus comprising:
a semiconductor substrate including a first doped region, a second doped region, and a third doped region between the first and second doped regions, the third doped region including a temperature sensitive semiconductor material;
a first contact coupled to the first doped region;
a second contact opposite the first contact coupled to the second doped region; and
an isolation trench to circumscribe the third doped region.

2. The apparatus of claim 1, wherein the first and second doped regions having a higher dopant concentration than the third doped region.

3. The apparatus of claim 1, wherein the third doped region is an epitaxy region having a lower dopant concentration than the first and second doped regions.

4. The apparatus of claim 1, wherein the isolation trench includes a non-conductive material.

5. The apparatus of claim 1, wherein at least one of a voltage or current source is coupled to the first contact, and a current path is defined from the first contact to the second contact through the third doped region circumscribed by the isolation trench.

6. The apparatus of claim 1, wherein a resistance between the first contact and the second contact is greater than or equal to 5000 k$\Omega$.

7. The apparatus of claim 1, wherein a resistance between the first contact and the second contact corresponds to a perimeter of the isolation trench.

8. The apparatus of claim 1, wherein the third doped region is trimmed to adjust a resistance of the third doped region.

9. The apparatus of claim 1, wherein the first contact is in contact with the first doped region, the first doped region is in contact with the third doped region, the third doped region is in contact with the second doped region, and the second doped region is in contact with the second contact.

10. The apparatus of claim 1, further including:
a third contact coupled to the first doped region;
a fourth contact opposite the fourth contact coupled to the second doped region;
the third doped region between the first and second doped regions; and
a second isolation trench to circumscribe the third doped region.

11. The apparatus of claim 10, wherein the fourth contact is the second contact.

12. The apparatus of claim 10, further including a bondpad to couple to the first and third contacts.

13. The apparatus of claim 12, wherein:
a first region between the first and second contacts corresponds to a first thermistor and a second region between the third and fourth contacts corresponds to a second thermistor; and
the bondpad couples the first thermistor to the second thermistor in parallel.

14. The apparatus of claim 13, further including a fifth contact corresponding to a third thermistor, the bondpad to couple the first and third contacts with the fifth contact to couple the first, second, and third thermistors in parallel.

15. The apparatus of claim 10, wherein the third doped region and the fifth doped region are trim linked in series.

16. An apparatus comprising:
a thermistor unit generator to generate a thermistor unit by applying a bondpad to a thermistor unit cells in a thermistor array to satisfy a target resistance by coupling the thermistor unit cells in parallel;
a resistance determiner to determine a resistance of the thermistor unit; and
a trimmer to, when the determined resistance is not within a threshold range of the target resistance, trim one or more of the thermistor unit cells of the thermistor unit to adjust the resistance.

17. The apparatus of claim 16, further including a thermistor array generator to generate the thermistor unit cells in the thermistor array.

18. The apparatus of claim 16, wherein the thermistor unit cells are vertically constructed and include isolation trenches to increase the resistance of the thermistor unit cells.

19. The apparatus of claim 16, wherein the threshold range corresponds to a tolerance value.

20. A method comprising:
generating a thermistor unit by applying a bondpad to thermistor unit cells in a thermistor array to satisfy a target resistance by coupling the thermistor unit cells in parallel;
determining a resistance of the thermistor unit; and
when the determined resistance is not within a threshold range of the target resistance, trimming one or more of the thermistor unit cells of the thermistor unit to adjust the resistance.

* * * * *